United States Patent [19]

Francheteau et al.

[11] Patent Number: 5,038,060
[45] Date of Patent: Aug. 6, 1991

[54] ACTIVE VERY-HIGH FREQUENCY CIRCUIT OF THE ALL-PASS TYPE UTILIZING AN RC NETWORK WHOSE CAPACITANCE IS THE GATE-SOURCE CAPACITANCE OF A FET

[75] Inventors: Philippe Francheteau, Port-Saint-Pere; Ramesh Pyndiah, Valenton, both of France

[73] Assignee: U.S. Philips Corp., New York, N.Y.

[21] Appl. No.: 367,519

[22] Filed: Jun. 16, 1989

[30] Foreign Application Priority Data

Jun. 21, 1988 [FR] France .................. 88 08300

[51] Int. Cl.$^5$ ................... H03B 1/00; H03F 3/16
[52] U.S. Cl. .................... 307/520; 307/262; 328/55; 328/167; 330/277
[58] Field of Search .......... 307/511, 262, 520, 521; 328/55, 155, 167; 330/277, 294; 333/165, 173, 28 R

[56] References Cited

U.S. PATENT DOCUMENTS 4,525,680  6/1985  Pan et al. ................. 330/277
4,591,802  5/1986  Asazawa .................. 330/277
4,878,033  10/1989  Wong ...................... 330/277

OTHER PUBLICATIONS

S. K. Altes et al., "Monolithic RC All-Pass Networks with Constant—Phase—Difference Outputs", IEEE Transactions on Microwave Theory and Techniques, vol. MTT-34, No. 12, Dec. 1986, pp. 1533–1537.

Primary Examiner—Timothy P. Callahan
Attorney, Agent, or Firm—Jack D. Slobod

[57] ABSTRACT

An all-pass type active circuit, realizable in the 8–12 GHz band has an inverting stage formed by a field effect transistor $Q_1$, to whose gate the input signal $V_E$ is applied through a resistor R constituting the resistance of an RC network, and whose gate-source capacitance $C_{GS}$ is constitutes the capacitance C of the RC network. The parameters of a negative feedback branch inserted between the input $V_E$ and the output $V_S$ of the inverter, including a resistor $R_0$ and a transmission line $L_0$, are chosen so that the elements of $Z=R_0$, $l=\tau v$, $R_0=2/G_{M0}$, where Z is the characteristic impedance of $L_0$, l is the length of $L_0$, v is the phase velocity of propagation, $\tau$ is the transit time of the electrons under the gate of $Q_1$ and $G_{M0}$ is the transconductance of $Q_1$. The phase shift between $V_E$ and $V_S$ at an operating frequency $\omega$ is a function of the time constant $\tau$ of the RC network. Two such all-pass type circuits, fed by a common input signal $V_E$, and having different respective time constants $\tau_1$, $\tau_2$, provide a predetermined phase difference (90°) at $\omega$ between their respective outputs $V_{S1}$, and $V_{S2}$.

11 Claims, 5 Drawing Sheets

ACTIVE VERY-HIGH FREQUENCY CIRCUIT OF THE ALL-PASS TYPE UTILIZING AN RC NETWORK WHOSE CAPACITANCE IS THE GATE-SOURCE CAPACITANCE OF A FET

BACKGROUND OF THE INVENTION

1. Field of the Invention

The ivention relates to an active very-high frequency circuit of the all-pass type, comprising an amplifier stage and an RC network.

The invention finds its application in realizing image frequency rejection mixers intended, for example, for receiver front ends for signals relayed by artificial satellites or for microwave radio signals in general. The invention also finds its application in realizing modulators for four or more phases.

2. Discription of the Related Art

A phase-shift circuit is known from the publication entitled: "Monolithic RC All-Pass Networks with Constant-Phase-Difference Outputs" by Stephen K. ALTES et al., published in "IEEE Transactions on Microwave Theory and Techniques", VOL. MTT-34, No. 12, Dec. 1986, pp 1533-1537.

This document describes a phase-shift circuit realised on the basis of an RC network, comprising first of all two field effect transistors in a buffer arrangement for decreasing the output impedance of the stage preceding the RC network. Each of these transistors has its drain connected directly to a d.c. supply voltage, its source connected to ground through a resistor and has a considerable gate width (120 $\mu$m). Each transistor receives at its gate an input signal having the same amplitude as that of the signal received by another transistor but having the opposite phase.

The source of each of the transistors is also connected to one of the ends of a network formed by four parallel branches. Each branch is constituted by a series RC network. The outputs of the phase-shift circuit are connected to the node of the capacitor and the resistor of each branch. The resistors and capacitors of each branch are provided such that each output has the same amplitude and a phase difference of 90° relative to the next output. Furthermore, a switching circuit is provided for switching from one pair of outputs to another pair.

This circuit operates in the 220-280 MHz band, which frequency is much too low for the applications considered for this invention, these applications requiring a phase shifter operating at least in the 8-12 GHz band.

In the above publication a second circuit operating in the 3-5 GHz band is discussed. But this frequency domain is again too low for the applications under consideration. This result is achieved in this second circiut because it is a second-order circuit which is obtained by adding a certain number of components. A large number of components is still unfavourable for large scale integration which is searched for.

In addition, the second-order ciruciuts have considerable insertion losses relative to first-order circuits. Moreover, its operation is based on the same principle as the above first-order circuit.

It is important to understand that in the prior-art circuits the load impedance of these circuits (or input impedance of the following circuit) appears in the transfer function so that the modulus (absolute value) of this transfer function depends on a time constant in which this impedance occurs, and on the frequency. The transfer function is thus that of a non-ideal all-pass function.

In order that the prior-art circuit(s) have a transfer function which is nearest possible to the ideal all-pass function, two conditions are to be fulfilled at the same time. First the output impedances of the buffered transistors are to be low with respect to the resistance of the RC network. Secondly, the input impedance of the next stage is to be high with respect to the impedance of the capacitor of the RC network.

Since the impedances of these preceding and following stages are fixed, the transfer function of the prior art network(s) can never be an ideal all-pass function, and this is more and more perceptible accordingly by as the frequency increases.

On the other hand, in each of the RC networks the values of the capacitor and resistor are fixed so as to obtain different time constants, allowing obtaining the desired phase shift on each path. From this it results first of all that the gain on each path is different. Then, if it is desired to increase the operating frequency, the result is that the RC products have to be diminished in order to diminish the time constants. Now we have seen hereinbefore that the resistor and capacitor values of the RC networks have to be maintained within certain boundaries imposed by the impendances of the preceding and following circuits, in order to remain as near to the ideal all-pass function as possible.

Under these conditions, the prior-art circuit(s) remains (remain) restricted to relatively low frequencies, or rather shows (show) very rapidly degraded performance as regards amplitude and phase.

It is also important to understand that the prior-art circuit(s) always requires (require) two input signals having the same amplitude and opposite phase. On one hand the generation of these signals on the basis of a single signal requires the introduction of an additional circuit, which augments the surface of the network and its power consumption. On the other hand it is very difficult to obtain signals having exactly the same amplitude and opposite phase.

SUMMARY OF THE INVENTION

It is thus an object of the invention to provide an all-pass active circuit which has a substantially ideal all-pass transfer function.

This object is achieved by means of an active circuit of the RC-type as described in the preamble and characterized in that the amplifying stage comprises an inverting stage formed by a field effect transistor $Q_1$ arranged as an inverter, to whose gate a very high frequency input signal $V_E$ is applied through a resistor R constituting the resistance of the RC network, and whose gate-source capacitance $C_{GS}$ is used for constituting the capacitance C of the RC network, and in that the amplifying stage further comprises a negative feedback branck inserted between the very high frequency input $V_E$ and the very-high frequency output $V_S$ of the inverting stage, which negative feedback branch includes a resistor $R_0$ and a transmission line $L_0$, and in that the characteristic features of the elements of this circuit are interrelated by the following conditions in order to obtain an indeal all-pass transfer function:

a) $Z = R_0$ b) $l = v\tau$ c) $R_0 = 2/G_{M0}$ where Z is the characteristic impedance of the line $L_0$ l is its physical length v is the phase velocity of propagation $\tau$ is the transit time of the electrons under the gate of the inverting transistor $Q_1$ and $G_{MO}$ is the transconductance of the inverting transistor $Q_1$.

Under these conditions the circuit according to the invention can specifically attain frequencies of the order of 12 GHz or 18 GHz according to the technology employed for its realization.

In an embodiment of the circuit, the latter is characterized in that the gate source capacitance $C_{GS}$ of the transistor $Q_1$ and the resistor R are furthermore provided for supplying a time constant $\tau_1$ of the circuit havin a value to produce a relative phase difference of 45° between the very-high frequency input signal $V_E$ and the very-high frequency output signal $V_{S1}$ available at the drain of the inverting transistor $Q_1$.

In a further embodiment of the circuit, the latter is characterized in that the gate source capacitance $C_{GS}$ of the transistor $Q_1$ and the resistor R are furthermore provided for supplying a time constant $\tau_2$ of the circuit having a value to produce a relative phase difference of 135° between the very-high frequency input signal $V_E$ and the very-high frequency output signal $V_{S2}$ available at the drain of the transistor $Q_1$.

One of the objects of the invention is also to provide an active 0°–90° phase shifter operating at very high frequencies on the basis of a single input signal, and showing good performance as regards amplitude deviation and phase deviation.

According to the invention, a phase-shift circuit for supplying two very-high frequency output signals $V_{S1}$ and $V_{S2}$ having the same amplitude and a relative phase difference of 90° on the basis of a single very-high frequency input signal $V_E$ is constituted by an all-pass circuit in accordance with the first embodiment coupled via the input $V_E$ to an all-pass circuit in accordance with a second embodiment.

Under these conditions, this phase-shift circuit operates at very high frequencies mentioned hereinbefore, but it also supplies output signals of the same amplitude with a precision of ±0.1 dB, and whose phase difference is 90° with a precision of ±0.6°, all this on the basis of a single input signal.

One of the objects of the invention is also to provide an all-pass circuit and a phase-shift circuit, which may both be integrated, for example on gallium arsenide, a semiconductor material which is particularly favourable for very-high frequency realizations, in a manner such that and the circuits can be fabricated in combination with other very-high frequency circuits.

In a preferred embodiment this network and this circuit are realized by means of field effect transistors of the MESFET type for a maximum operating frequency of the order of 12 GHz, and by means of field effect transistors of the HEMT type for a maximum operating frequency of the order of 18 GHz, and integrated with the other elements on gallium arsenide (GaAs).

BRIEF DISCRIPTION OF THE DRAWING

The invention will be better understood by means of the following description illustrated by the annexed drawing figures of which:

FIG. 1a diagrammatically represents an all-pass RC cell according to the invention, FIG. 1b represents the equivalent circuit of the circuit as shown in FIG. 1a.

FIG. 2 represents a 0°–90° phase-shift circuit constituted by two all-pass cells as shown in FIG. 1, admitting the same input signal, FIG. 3a represents, plotted against the frequency f(GHz), the amplitude difference $\Delta A$ (in $10^{-2}$ dB) and the phase difference $\Delta \phi$ in degrees, for an optimum value of the negative feedback resistor $R_0$, FIG. 3b represents the same variables for a value of the negative feedback resistor $R_0$ which is smaller than the optimum value, FIG. 3c represents the same variables for a value of the negative feedback resistor $R_0$ which exceeds the optimum value, FIG. 4a respresents, plotted against frequency, the amplitude and phase variations of the input impedance $Z_I$ of the phase-shift circuit realized by means of the HEMT transistors, and FIGS. 4b and 4c represent, plotted against frequency, the respective amplitude and phase variations of the output impedances $Z_{S1}$ and $Z_{S2}$ of the outputs of the phase-shift realized by means of the HEMT transistors.

DETAILED DESCRIPTION OF THE PREFERRED EMBODIMENTS

For the intended applications at very high frequencies, the all-pass circuit according to the invention as well as the phase-shift circuit formed on the basis of this all-pass circuit, are realized by means of field effect transistors, on a semiconductor substrate of the group III-V, for example, on gallium arsenide (GaAs).

Figure 1A:
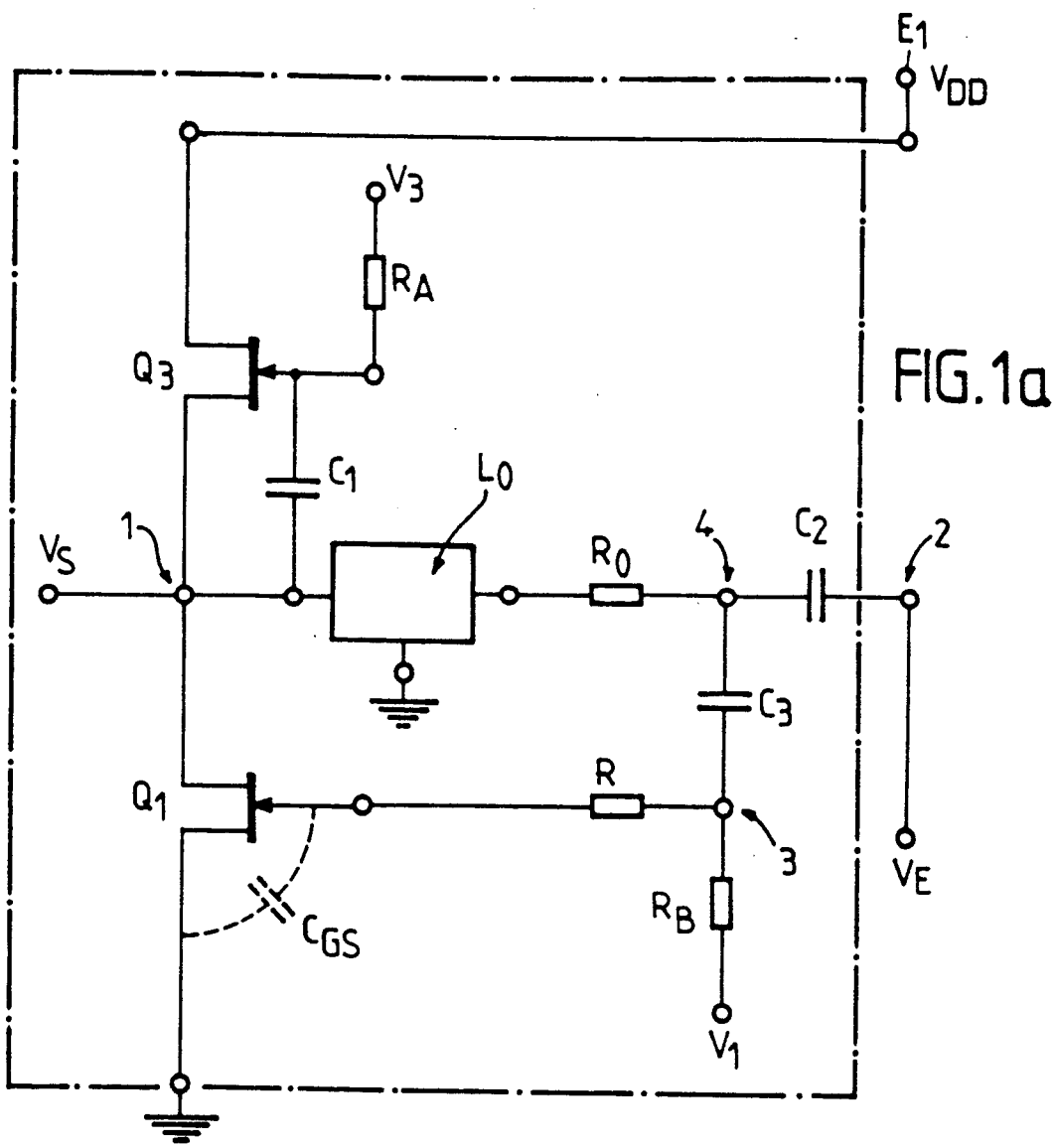

FIG. 1a diagrammatically shows the all-pass cell according to the invention. This cell comprises an inverting stage formed by the inverting transistor $Q_1$ and a load $Q_3$. The drain of the inverting transistor $Q_1$ is connected to a d.c. supply voltage $V_{DD}$ across the load $Q_3$ and its source is directly connected to ground.

The transistor $Q_1$ exhibits a gate-source capacitance designated by $C_{GS}$.

This cell also includes an RC network formed by the resistor R whose one end is connected to the gate of the inverting transistor $Q_1$ and whose other end is connected to the very-high frequency input $V_E$ of the circuit, and formed by the gate-source capacitance $C_{GS}$ of the transistor $Q_1$.

Whereas this RC network is connected to the input of the all-pass cell according to the invention, the transfer function of this cell does not depend on the output impedance of the preceding stage, as was the case in the networks known from the state of the art.

The load $Q_3$ is formed preferably by a field effect transistor whose gate is biased through a resistor $R_4$ by a d.c. voltage $V_3$, whose drain is connected directly to the d.c. supply voltage $V_{DD}$ and whose source is connected to the drain of the inverting transistor $Q_1$ constituting the output node 1 of the cell at which the output signal $V_S$ is available. The gate of the load transistor $Q_3$ is further connected to its source via a capacitor $C_1$.

According to the invention, the stage described above is arranged as a negative feedback amplifier by means of a branch inserted between the input $V_E$ at node 4 and the output $V_S$ at node 1. This branch comprises a resistor $R_0$ and a transmission line $L_O$ arranged in series.

This negative feedback branch is isolated from input 2 $V_E$ by a capacitor $C_2$ inserted between the nodes 2 and 4 and from the branch R-$C_{GS}$ by a capacitor $C_3$ inserted between the nodes 4 and 3. On the other hand, the gate of the inverting transistor $Q_1$ is biased by a d.c. voltage $V_1$ through a resistor $R_B$ inserted between $V_1$ and the end of the resistor R in the R-$C_{GS}$ network at node 3.

The bias voltages $V_1$ and $V_3$ are provided variably so as to allow of adjusting the amplitude and the phase of the output signal $V_S$.

Figure 1B:
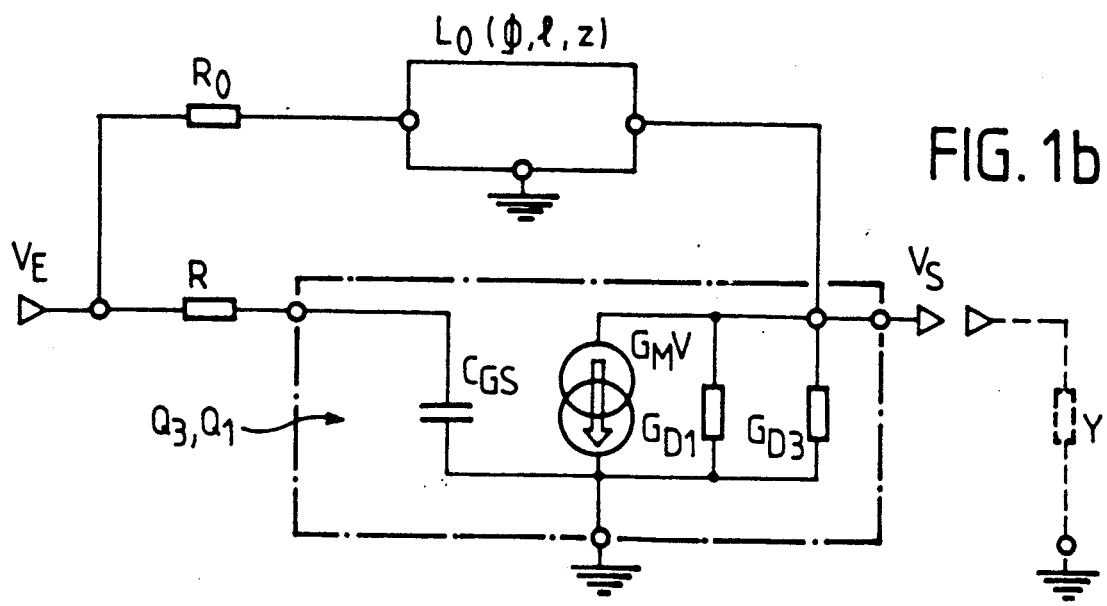

In order to obtain the transfer function of an ideal all-pass cell, conditions are imposed on the elements of the cell, which conditions will be better understood when considering the equivalent diagram of this circuit represented in FIG. 1b together with the diagram of FIG. 1a.

TABLE I $$\phi = \beta l = \frac{2\pi f}{v} \cdot l = \omega l/v \quad (1)$$

$$G_M = G_{MO} e^{-j\omega \tau} \quad (2)$$

$$F(j\omega) = \frac{V_S}{V_E} = \quad (3)$$

$$-\frac{G_M(R_0 \cos\phi + jZ \sin\phi) - (1 + j\omega R C)}{(1 + j\omega R C)}$$

$$\left[ (G_D + Y)(R_0 \cos\phi + jZ \sin\phi) + \left( \cos\phi + j\frac{R_0}{Z} \sin\phi \right) \right]$$

$$F(j\omega) = -e^{-j\phi} \frac{G_{MO} R_0 e^{-j(\omega\tau - \phi)} - (1 + j\omega R C)}{[1 + R_0 (G_D + Y)](1 + j\omega R C)} \quad (4)$$

$$F(j\omega) = -e^{-j\phi} \frac{G_{MO}}{[G_{MO} + 2(G_D + Y)]} \frac{(1 - j\omega R C)}{(1 + j\omega R C)} \quad (5)$$

$$\frac{(1 - j\omega R C)}{(1 + j\omega R C)} \quad (6)$$

$$-e^{-j\phi} \frac{G_{MO}}{[G_{MO} + 2(G_D + Y)]} \quad (7)$$

$$F_1(j\omega) = -e^{-j\phi} \frac{G_{MO}}{[G_{MO} + 2(G_D + Y)]} \frac{(1 - j\omega R_1 C)}{(1 + j\omega R_1 C)} \quad (8)$$

$$F_2(j\omega) = -e^{-j\phi} \frac{G_{MO}}{[G_{MO} + 2(G_D + Y)]} \frac{(1 - j\omega R_2 C)}{(1 + j\omega R_2 C)} \quad (9)$$

TABLE II

| Condition a: | $Z = R_0$ |
| --- | --- |
| Condition b: | $l = \tau V$ |
| Condition c: | $R_0 = 2/G_{MO}$ |

In FIG. 1b the line $L_0$ is distinguished by its physical length l by its electrical length $\Phi$ given by equation (1) of Table I, where $\beta$ is the phase constant of the line, f is the operating frequency and v is the phase velocity of propagation, and distinguished by its characteristic impedance Z;

Y is the load constituted by the admittance of the input signal to the stage (or circuit) following the all-pass cell;

$G_{D1}$ and $G_{D3}$ are the drain-source conductances of the transistors $Q_1$ and $Q_3$ respectively, and $G_D$ their equivalent conductance; and $G_{MO}$ is the transconductance of the transistor $Q_1$, and $\tau$ is the transit time of the carriers under the gate of this transistor, which results in the fact that the transconductance $G_M$ of the inverting stage is given by equation (2) of Table I.

Under these conditions the transfer function of the all-pass unit cell of FIG. 1a is given by equation (3) of Table I, in which equation $C_{GS}$ has been written as C for simplicity.

As a first condition will be chosen to realized $R_0 = Z$ (condition a). The transfer function of the all-pass cell can thus be written more simply in form of the equation (4) of Table I.

The condition a is fulfilled when the characteristic impedance Z of the line $L_0$ is chosen to be equal to the resistor $R_O$ of the negative feedback branch.

As a second condition will be chosen $$\Phi = \Omega \tau \text{ (knowing that } \omega = 2\pi f)$$

Thus, equation (1) of the Table I leads to writing this second equation in the form of:

$$l = v \tau \quad \text{(condition b)}.$$

Condition b is fulfilled when the physical length l of the line $L_0$ produces a delay which compensates for the signal delay between the input and the output of the inverting stage.

As a third condition will be chosen $$R_0 = 2/G_{MO} \quad \text{(condition c)}$$

Condition c is fulfilled when, in addition, the resistor $R_0$ of the negative feedback branch is chosen to have the value of two times the inverse of the transconductance of inverting transistor $Q_1$.

The transfer function of the all-pass unit cell according to the invention can thus be described in the form of equation (5) of the Table I.

As shown in equation (5) of the Table I the transfer function $F(j\omega)$ is written in the form of the function of an ideal all-pass (see term (6) of the Table I) which is multiplied by a constant independent of the value of the resistor R and of the capacitor C of the RC network (see term (7) of Table I).

Under these conditions, the amplitude of $F(j\omega)$ certainly depends on the frequency, but it does not depend on the values of R and C, worded differently, the amplitude of the output signal does not depend on the time constant of the RC network.

The circuit comprises a single parasitic element which is the gate-drain capacitance of the inverting transistor $Q_1$. But this element is of minor importance because this gate-drain capacitance is very weak with respect to the gate-source capacitance of the field effect transistor.

The gate-drain capacitance is thus practically short-circuited by the gate-source capacitance.

The gate-source capacitance $C = C_{GS}$ of the transistor $Q_1$ is a function of the dimensions of this transistor. To increase the operating frequency of the circuit, one may either diminish the size of the inverting transistor $Q_1$, or diminish the resistance R of the RC network, which allows of diminishing the time constant of the circuit.

If one wishes to diminish the capacitance C by diminishing the gate width W of the transistor $Q_1$, the transconductance $G_{MO}$ will diminish. In order to fulfill the condition c (see Table II), the resistance $R_0$ of the negative feedback branch thus has to increase, which entails that for fulfilling the condition a (see Table II) the characteristic impedance Z of the line has to increase. The increasing of the characteristic impedance Z of the line $L_0$ may be obtained by diminishing the line width.

If one chooses to realize the circuit on gallium arsenide, which is a particularly favourable material for forming very-high frequency networks, the maximum characteristic impedance which may be obtained for a line is of the order of 100 to 120 Ω as a result of the edge effect of the line.

On this same material the lower limit of the value of the resistor R is situated around 30 or 40 Ω in order to properly control the exact value of this resistor. Actually, any transistor such as $Q_1$ to which the resistor R is connected, has gate contacts showing a given resistance, and the resistance R of the RC network is to remain large relative to the resistance of the gate contact of the inverting transistor $Q_1$.

The circuit according to the invention can be realised either by means of field effect transistors of the MES-FET type or by means of field effect transistors of the HEMT type. The latter transistors are preferred for obtaining circuits operating at higher frequencies because their transconductance is on average two times higher than that of the former transistors.

The bias voltage $V_1$ can be adjusted to make the transconductance $G_M$ of the inverting stage vary. In order to verify the condition c, this allows of adjusting the value of the negative feedback resistor $R_0$ in the case in which the latter would differ from the optimum value, for example, owing to the dispersion of the components during the realization of the circuit.

The bias voltage $V_3$ is provided for fixing the drain current of the inverting transistor $Q_1$ so as to adjust the quiescent point.

According to the invention, a 0°–90° phase shifter can furthermore be realized on the basis of the all-pass unit cell described above. In order to realize this phase shifter, two cells of the type of this all-pass cell are coupled by means of their input node 2. Consequently, this phase shifter operates by means of a single input $V_E$.

Figure 2:
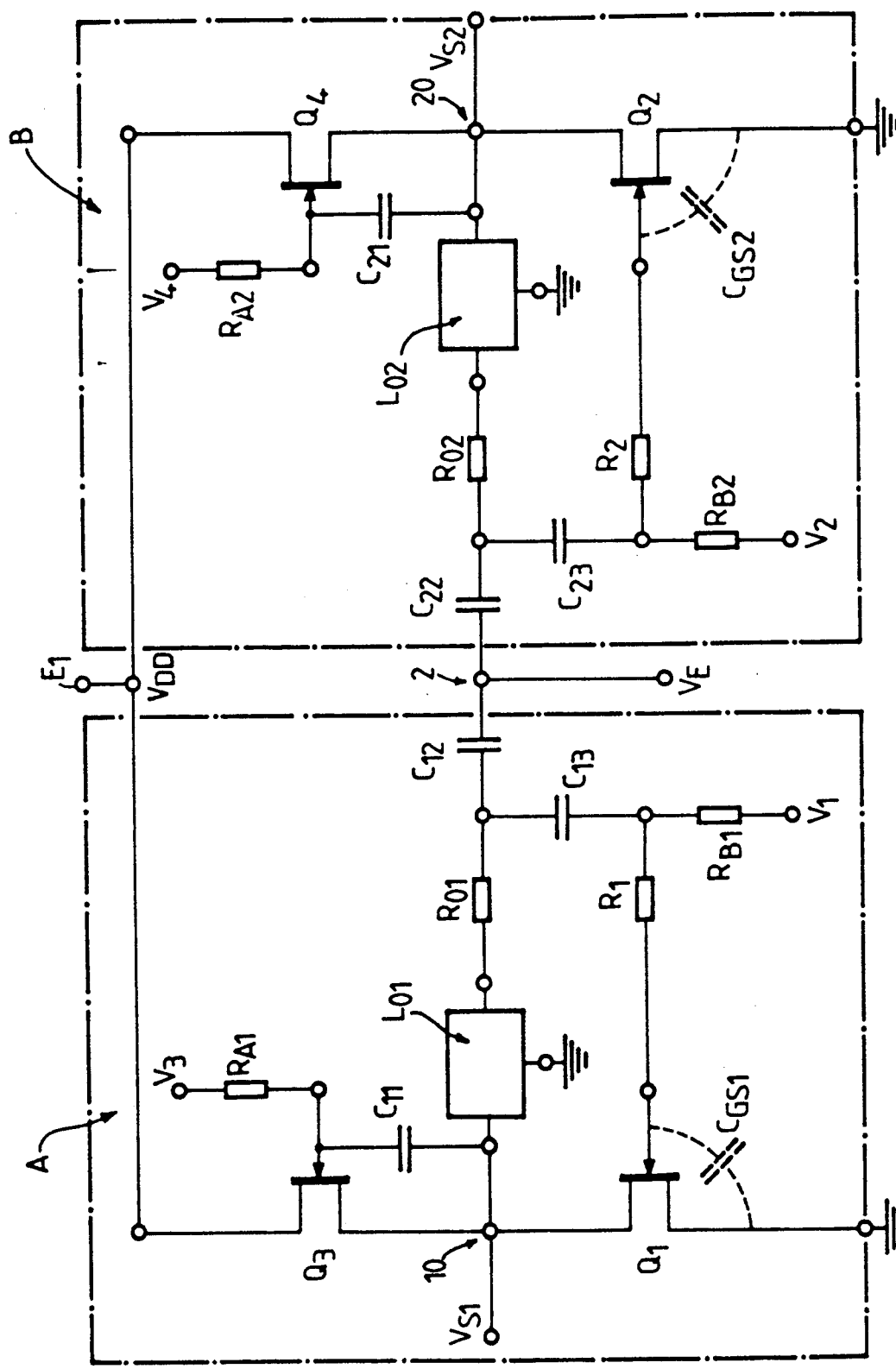

As represented in FIG. 2, this phase shifter thus comprises the two cells A and B respectively.

Each cell comprises an inverting transistor $Q_1$, $Q_2$; a load transistor $Q_3$, $Q_4$; an RC network formed by the resistor $R_1$ and the gate-source capacitance $C_1 = C_{GS1}$ of $Q_1$ for A; an RC network formed by the resistor $R_2$ and the gate-source capacitance $C_2 = C_{GS2}$ of $Q_2$ for B; a negative feedback branch formed by the resistor $R_{01}$ and the transmission line $L_{01}$ for A; a negative feedback branch formed by the resistor $R_{02}$ and the transmission line $L_{02}$ for B.

In A, for the load $Q_3$, the gate bias voltage is $V_3$ and the bias resistor is $R_{A1}$, and for the inverter $Q_1$ the gate bias voltage is $V_1$ and the bias resistor is $R_{B1}$.

In B, the load is $Q_4$, of which the gate bias voltage is $V_4$ and the bias resistor is $R_{A2}$; and the inverter is $Q_2$ of which the gate bias voltage is $V_2$ and the bias resistor is $R_{B2}$.

The isolation capacitors $C_1$, $C_2$, $C_3$ of the unit cell described hereinbefore become $C_{11}$, $C_{12}$, $C_{13}$ and $C_{21}$, $C_{22}$, $C_{23}$ respectively, in the cells A and B.

The output signals $V_{S1}$ and $V_{S2}$ occur at the points 10 and 20 at the drains of the inverting transistors $Q_1$ and $Q_2$ respectively.

The values of the elements of each of the RC networks in the cells A and B are chosen for producing the respective time constants $$\tau_1 \text{ and } \tau_2$$

which allow of obtaining, on the basis of the very-high frequency input signal $V_E$ common to the two cells, very-high frequency output signals $V_{S1}$ and $V_{S2}$ which, relative to the input signal $V_E$, have
a 45° phase shift for the cell A
a 135° phase shift for the cell C.
This is obtained with:

$$\omega\tau_1 \omega 0.6$$

$$\omega\tau_2 \omega 3.7$$

Under these conditions, the output signals $V_{S1}$ and $V_{S2}$ show a 90° phase shift relative to one another.

The transfer functions of each of the cells A and B respectively, are given by the equations (8) and (9) of the Table I. These functions show that the amplitude deviation does not depend on the time constants of the cells.

Table II recalls the conditions a, b, c imposed on the two respective cells and the following Tables III and IV are pertinent to this discussion:

TABLE III

| | | Optimum value | |
|---|---|---|---|
| $R_0 = R_{01} = R_{02}(Q)$ | 105 | 116.75 | 130 |
| Amplitude difference ΔA(dB) | −0.04 | −0.08 | 0.1 |
| | 0.07 | 0.07 | 0.02 |
| maximum phase difference Δφ (degrees) | 92.7 | 90.5 | 89.4 |
| minimum phase difference | 91.1 | 89.3 | 88.2 |
| D.C. $E_1$ | 6 | 6 | 6 |
| voltages $V_1$ | −0.02 | −0.23 | −0.36 |
| (volts) $V_2$ | 0.02 | −0.23 | −0.44 |
| $V_3$ | 2.85 | 2.85 | 2.85 |
| $V_4$ | 2.85 | 2.85 | 2.85 |

TABLE IV

| COMPONENTS | | ALL-PASS A | | ALL-PASS B | |
|---|---|---|---|---|---|
| HEMT type transistor | | $Q_1$ | $Q_3$ | $Q_2$ | $Q_4$ |
| Gate length = $L_g$ = 0.6 μm | | | | | |
| Gate width W | | $W_1$ = 70 μm | $W_3$ = 50 μm | $W_2$ = 70 μm | $W_4$ = 50 μm |
| Number of gate fingers N | | $N_1$ = 2 | $N_3$ = 1 | $N_2$ = 2 | $N_4$ = 1 |
| Resistors: | | $R_{A1}$ = 10 kΩ | | $R_{A2}$ = 10 kΩ | |
| | | $R_{B1}$ = 10 kΩ | | $R_{B2}$ = 10 kΩ | |
| | | $R_1$ = 51.9 Ω | | $R_2$ = 394 Ω | |
| | | $R_{01}$ = 116.75 Ω | | $R_{02}$ = 116.75 Ω | |
| Capacitors: | | $C_{01}$ = 0.5 pF | | $C_{02}$ = 0.5 pF | |
| | | $C_{11}$ = 10 pF | | $C_{12}$ = 10 pF | |
| | | $C_{21}$ = 2 pF | | $C_{22}$ = 2 pF | |
| Transmission Line | Height | h = 100 μm | | h = 100 μm | |
| on gallium | Width | W = 5 μm | | W = 5 μm | |
| arsenide GaAs | Length | l = 359 μm | | l = 359 μm | |
| | | | $E_1$ = 6 V | | |
| D.C. voltages | | $V_1$ = −0.23 V | | $V_2$ = −0.23 V | |

TABLE IV-continued

| COMPONENTS | ALL-PASS A | ALL-PASS B |
|---|---|---|
| | $V_3 = 2.85$ V | $V_4 = 2.85$ V |

Table III shows the results obtained by means of a phase-shift circuit according to the invention, constituted by the elements of Table IV, that is, realised on gallium arsenide by means of HEMT transistors.

Table III specifically shows the amplitude difference $\Delta A$ between the signals $V_{S1}$ and $V_{S2}$ when the negative feedback resistor $R_0$ ($R_{01}$ and $R_{02}$ respectively) has the optimum value of 116.75 Q and when, owing to the dispersion, it would have the value of 105 Q, or 130 Q, Table III also shows the maximum phase shift and the minimum phase shift corresponding with the above values of the resistor $R_0$. In this Table III it will be noted that in order to compensate for the deviation of $R_0$, the values of the bias voltages $V_1$ and $V_2$ respectively, have been adjusted.

Table IV shows maximum values of the components for realising the network according to the invention with transistors of the HEMT type.

Figure 3A:
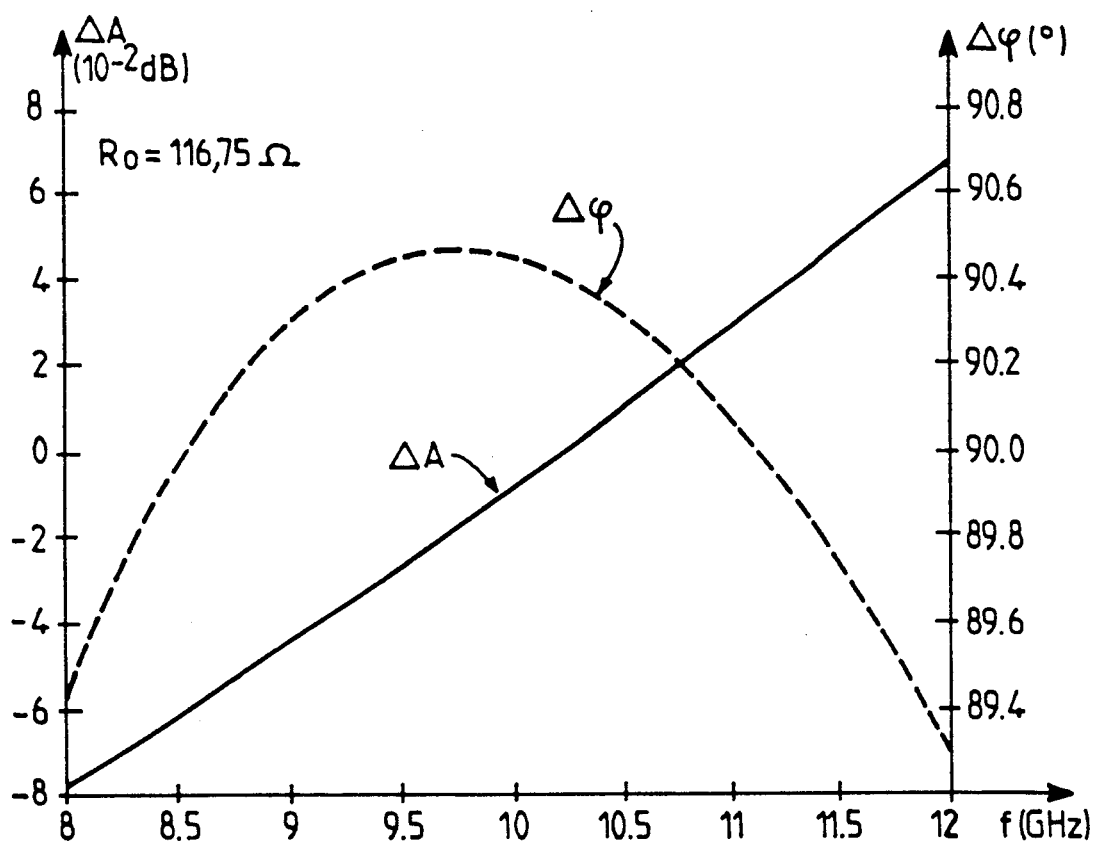

FIG. 3a represents, by means of the solid line curve, the difference in amplitude $\Delta A$ in $10^{-2}$ dB between the two output signals $V_{S1}$ and $V_{S2}$ of a 0°-90° phase shifter realized in accordance with the invention and by means of optimum value components entered in the Tables III and IV, this curve being plotted against the frequency f in GHz; and by means of the dashed-line curve, the phase difference $\Delta \phi$ between the signals of the outputs $V_{S1}$ and $V_{S2}$ also plotted against the frequency f in GHz.

$R_0 = 116.75 \omega$ $V_1 = -0.23$ V $V_2 = -0.23$ V

This FIG. 3a shows that, in the 8-12 GHz frequency band and when the phase shifter is realized on gallium arsenide by means of HEMT transistors, the phase difference $\Delta \phi$ between the two outputs is 90°±0.6°, and that the amplitude difference $\Delta A$ is less than ±0.1 dB.

Figure 3B:
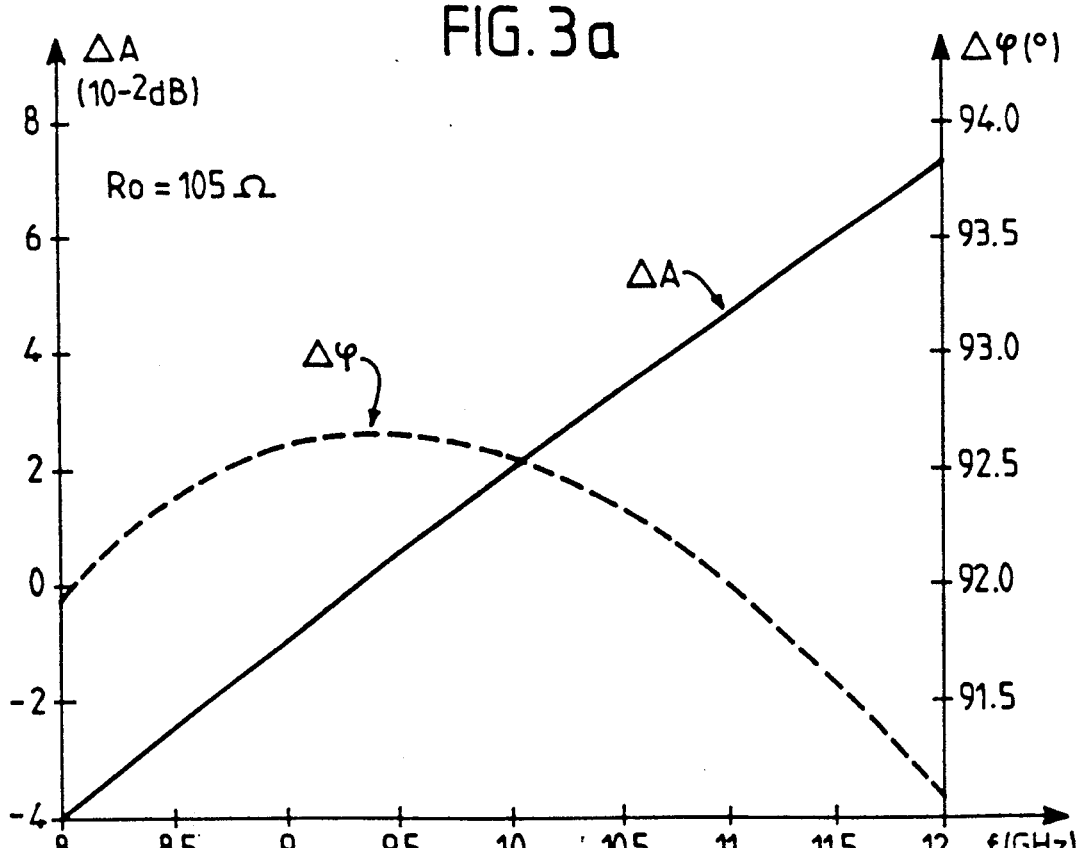

FIG. 3b represents by means of the solid line curve, the amplitude difference $\Delta A$ under the conditions for which the negative feedback resistor $R_O$ falls short of the optimum value (see Table III).

$R_0 = 105$ Ω

$V_1 = -0.02$ V $V_2 = 0.02$ V and the dashed line curve represents the phase difference $\Delta \phi$.

This FIG. 3b shows that when adjusting the gate bias voltages of the inverting transistors $Q_1$ and $Q_2$, the errors in the phase and amplitude differences which appear owing to the error at $R_O$ may be minimized. Under these conditions, between 8 and 12 GHz, the phase difference was situated between 91° and 92°7; and the amplitude difference was less than ±0.1 dB.

Figure 3C:
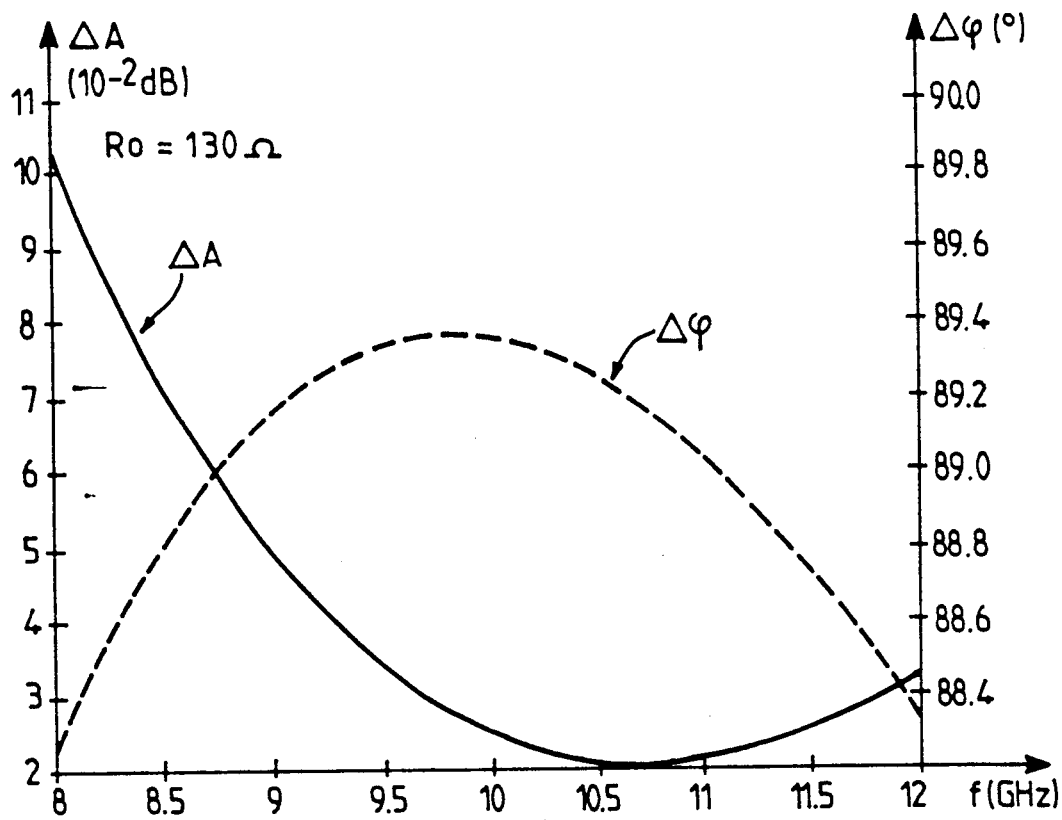

FIG. 3c represents, by means of the solid-line curve, the amplitude difference $\Delta A$ for the conditions in which the negative feedback resistor $R_0$ has a value exceeding the optimum value (see Table III)

$R_0 = 130$ Ω

$V_1 = -0.360$ V $V_2 = -0.440$ V and the dashed line represents the phase difference $\Delta \phi$.

This FIG. 3c shows that when the bias voltages $V_1$ and $V_2$ are adjusted, the errors in the phase and amplitude differences may be minimized. Under these conditions, between 8 and 12 GHz, the phase difference $\Delta \phi$ was situated between 88°2 and 89°4. The amplitude difference was less than ±0.1 dB.

Generally speaking, these results show that the preferred operating frequency of the circuit realized on gallium arsenide by means of HEMT transistors will be situated in the 8 to 12 GHz band with the components of Table IV. But, by changing the dimensions of HEMT transistors, one could obtain a correct operation to within the 10-18 GHz band.

Owing to the fact that the circuit according to the invention is a negative feedback amplifier, the well-advised choice of the elements allows of achieving that the input impedance $Z_I$ of the phase shifter is of the order of 50 ω, in the 8 to 12 GHz frequency band considered for the preceding embodiment.

Figure 4A:
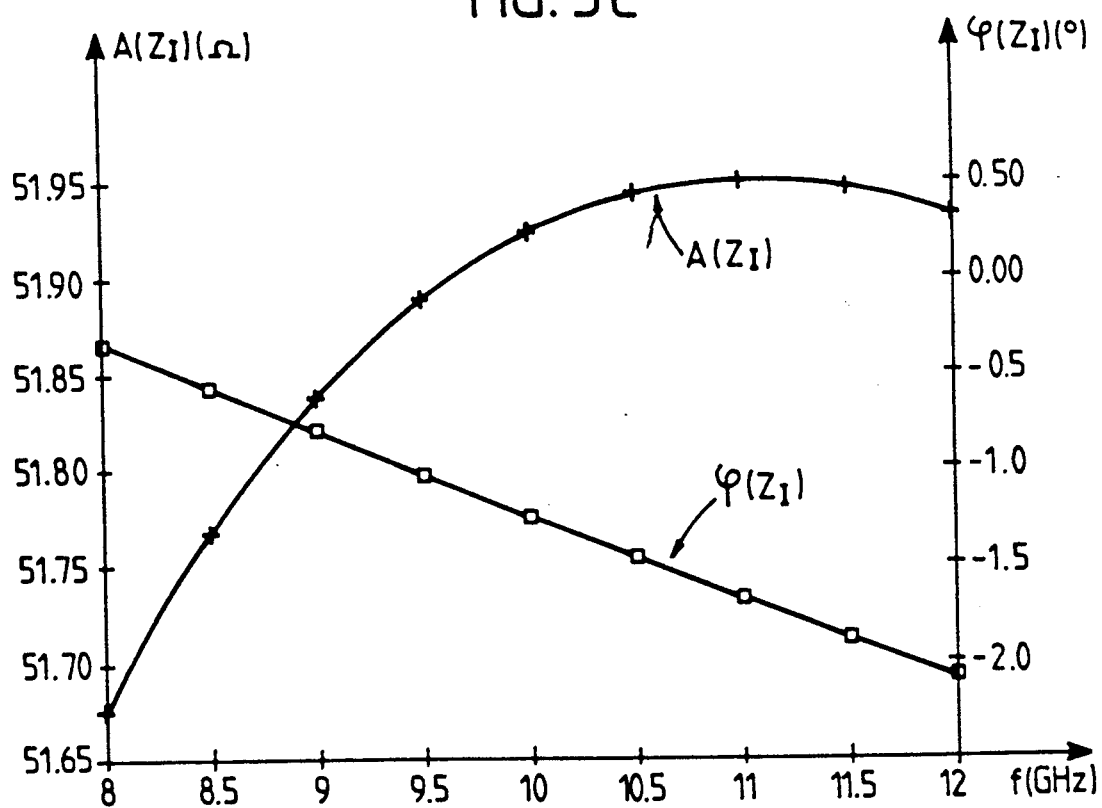

For this purpose, the FIG. 4a shows the amplitude $A(Z_I)$ of the input impedance of the phase shifter in this embodiment as well as the phase $\phi(Z_I)$ of this impedance of this frequency band.

Due to the well-advised choice of these same elements, the output impedance $Z_{S1}$ of the cell A of the phase shifter and the output impedance $Z_{S2}$ of the cell B of the phase shifter remain
  between 83 and 84 ω for the first impedance
  between 86 and 91 ω for the second impedance.

TABLE V

| COMPONENTS | ALL-PASS A | | ALL-PASS B | |
|---|---|---|---|---|
| MESFET type transistor<br>Gate length = Lg = 0,7/μm | $Q_1$ | $Q_3$ | $Q_2$ | $Q_4$ |
| Gate width W | $W_1 = 70$ μm | $W_3 = 50$ μm | $W_2 = 70$ μm | $W_4 = 50$ μm |
| Number of gate fingers N | $N_1 = 2$ | $N_3 = 1$ | $N_2 = 2$ | $N_4 = 1$ |
| Resistors: | $R_{A1} = 10$ kQ | | $R_{A2} = 10$ kQ | |
| | $R_{B1} = 10$ kQ | | $R_{B2} = 10$ kQ | |
| | $R_1 = 50$ Q | | $R_2 = 400$ Q | |
| | $R_{01} = 209$ Q | | $R_{02} = 209$ Q | |
| Capacitors: | $C_{01} = 0.5$ pF | | $C_{02} = 0.5$ pF | |
| | $C_{11} = 10$ pF | | $C_{12} = 10$ pF | |
| | $C_{21} = 2$ pF | | $C_{22} = 2$ pF | |
| Transmission Line<br>on gallium | Height h = 100 μm | | h = 100 μm | |
| | Width W = 5 μm | | W = 5 μm | |

TABLE V-continued

| COMPONENTS | ALL-PASS A | ALL-PASS B |
|---|---|---|
| arsenide GaAs | Length l = 359 μm | l = 359 μm |
| | | $E_1 = 6$ V |
| D.C. voltages | $V_1 = -0.23$ V | $V_2 = -0.23$ V |
| | $V_3 = 2.85$ V | $V_4 = 2.85$ V |

Figure 4B:
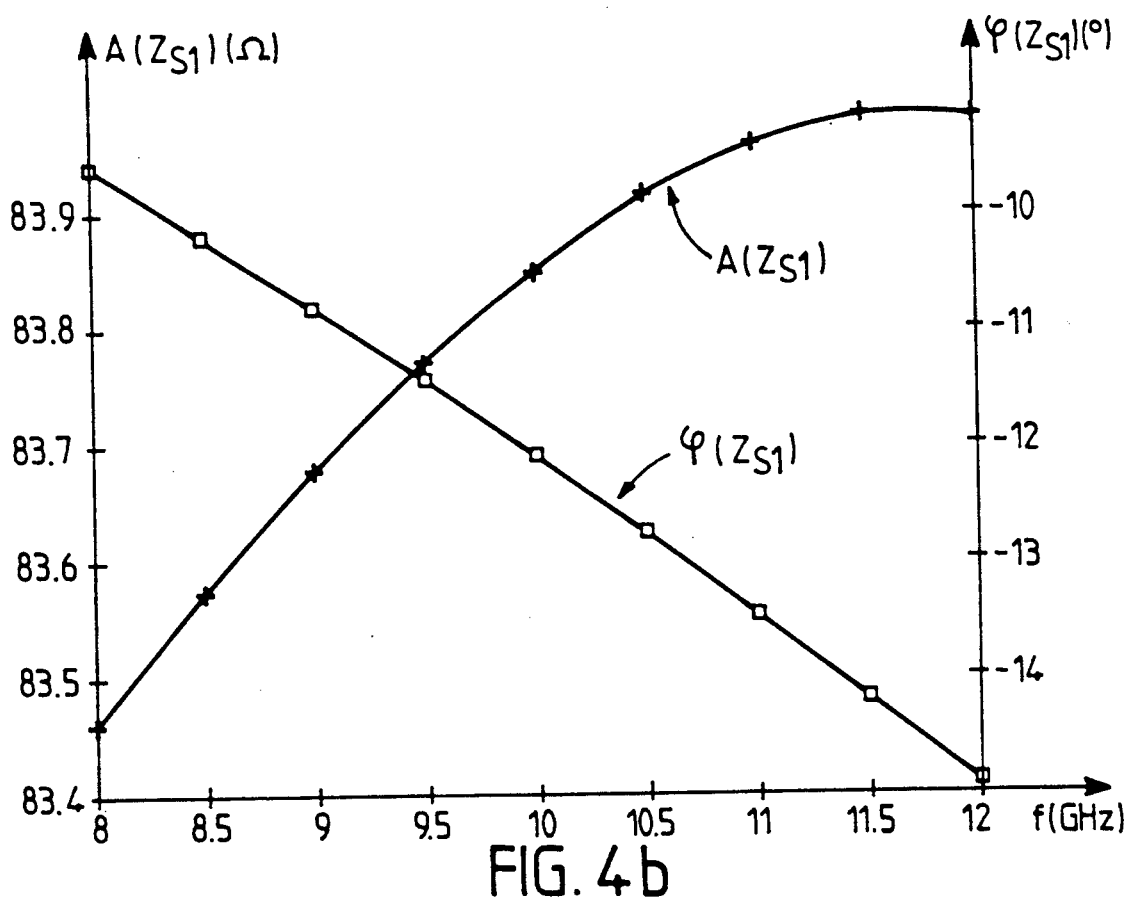
Figure 4C:
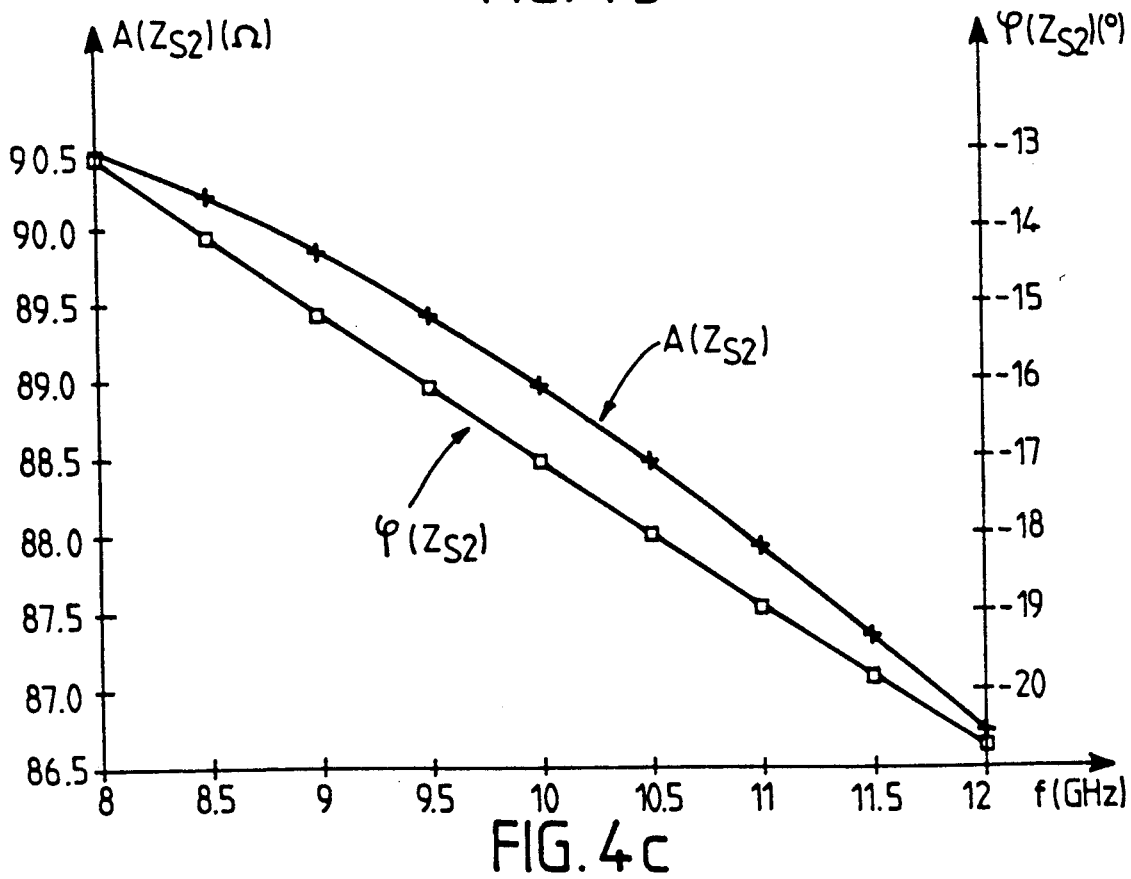

Thus, the FIGS. 4b and 4c show the respective amplitudes $A(Z_{S1})$ and $A(Z_{S2})$ of these output impedances, as well as the respective phases $\phi(Z_{S1})$ and $\phi(Z_{S2})$ of these impedances always in the above-described embodiment and for the same frequency band.

The output impedances of the phase shifter are thus of the order of two times the value of the input impedance.

The curves of the FIGS. 4a, 4b, 4c have been plotted for the cases in which the values of the phase shifter elements are optimal.

In another embodiment of the invention, in which one wishes to use MESFET transistors, for example, in order to fabricate them in combination with other associated circuits, then the maximum frequencies will be situated in the 8 to 12 GHz band.

The Table V below shows a set of characteristic values for realising the circuit according to the invention by means of MESFETs. It is to be noted that the transistors $Q_1$ and $Q_2$ of the inverters preferably have 2 gate fingers:

The performance of such a circuit realised by means of MESFETs is also very good as regards amplitude difference and phase difference of the two output signals $V_{S1}$ and $V_{S2}$.

It is to be noted that, in each of the embodiments of the invention, the inverting transistors $Q_1$ and $Q_2$ have been chosen to be identical in order to simplify the manufacture of the circuit, in the same way as the lines $L_{01}$ and $L_{02}$. Thus, the manufacturing efficiency of the phase shifter is improved.

We claim:

1. An active very-high frequency circuit of the all-pass type, comprising an inverting stage having an input for a very-high frequency input signal $V_E$ and an output for a very-high frequency output signal $V_S$, said inverting stage having a transfer function relating said output signal $V_S$ to said input signal $V_E$ which depends on a time constant equal to the product of a resistance and a capacitance of an included RC network, the inverting stage comprising a field effect transistor $Q_1$ whose drain-source path is in a series path with a load, said output signal $V_S$ being formed at a first point in said series path intermediate said drain-source path and said load, said first point being coupled to said output for said output signal $V_S$, and whose gate is coupled via a resistor R constituting the resistance of the RC network to a second point which is coupled to the input for said input signal $V_E$, and whose gate-source capacitance $C_{GS}$ constitutes the capacitance C of the RC network, and further comprising a feedback branch coupled between the first point and the output for said output signal $V_S$, which feedback branch includes, in cascade, a resistor $R_O$ and a transmission line $L_O$, wherein parameters of the feedback branch are interrelated by the following conditions:

a) $Z = R_O$
b) $l = \tau v$
c) $R_O = 2/G_{MO}$ where:

Z is the characteristic impedance of the line $L_O$
l is its physical length
v is the phase velocity of propagation
$\tau$ is the transit time of the electrons under the gate of the inverting transistor $Q_1$ and
$G_{MO}$ is the transconductance of the transistor $Q_1$.

2. A circuit as claimed in claim 1, wherein said first point is at the drain of the transistor $Q_1$ which drain is coupled to a d.c. supply voltage input $E_1$ via said load, and wherein said load is an active load formed by a field effect transistor $Q_3$, whose drain is connected to the d.c. supply voltage input $E_1$, whose source is connected to the drain of transistor $Q_1$ and whose gate is biased through a resistor $R_A$ coupled to a d.c. voltage input $V_3$, the gate of transistor $Q_3$ being further coupled to its source via a capacitor $C_1$.

3. A circuit as claimed in claim 2, wherein the gate of the transistor $Q_1$ is biased by a d.c. voltage input $V_1$ through a resistor $R_B$ connected between a third point and the d.c. voltage input $V_1$ and the resistor R being coupled between said third point and the gate of transistor $Q_1$, the input for the very-high frequency input signal $V_E$ being coupled to the second point by a capacitor $C_2$, and the said second and third points being coupled via a capacitor $C_3$, whereby, in order to fulfill the condition c), a compensation of the value $G_{MO}$ is obtained by variation of the input voltage $V_1$ in case the resistor $R_O$ has a value which is slightly different from an optimal value.

4. A circuit as claimed in claim 3, wherein the physical length l and a width W of the transmission line $L_O$ are chosen in a manner such that the conditions a) and b) are fulfilled.

5. A circuit as claimed in claim 4, characterized in that a width $W_G$ of the gate of the transistor $Q_1$ is arranged for providing the transconductance $G_{MO}$ to fulfill the condition c).

6. A circuit as claimed in claim 5, wherein the gate-source capacitance $C_{GS}$ of the transistor $Q_1$ and and resistor R are chosen for providing a time constant $\tau_1$ of the network which produces a relative phase difference of 45° between the very-high frequency input signal $V_E$ and the very-high frequency output signal $V_S$.

7. A circuit as claimed in claim 5, wherein the gate-source capacitance $C_{GS}$ of the transistor $Q_1$ and the resistor R are furthermore arranged for providing a time constant $\tau_2$ of the network which produces a relative phase difference of 135° between the very-high frequency input signal $V_E$ and the very-high frequency output signal $V_S$.

8. A phase shift circuit for producing, in response to a single very-high frequency input signal $V_E$, two very-high frequency output signals $V_{S1}$ and $V_{S2}$ having substantially the same amplitude and a relative phase difference of substantially 90°, this phase-shift circuit comprising first and second all-pass circuits of the same type having a common input for the input signal $V_E$ and respective outputs for the output signals $V_{S1}$ and $V_{S2}$, said first and second all-pass circuits comprising respective inverting stages with respective transfer functions relating the respective output signals $V_{S1}$ and $V_{S2}$ to said input signal $V_E$ dependent upon respective time constants $\tau_1$ and $\tau_2$ equal to the product of a resistance and a capacitance of associated respective RC networks chosen to produce the relative phase difference of 90° between the output signals $V_{S1}$ and $V_{S2}$, said respective inverting stages comprising respective field effect transistors $Q_1$ whose drain-source paths are in respective series paths with respective loads, said respective output signals $V_{S1}$ and $V_{S2}$ being formed at respective first points in said respective series paths intermediate said respective drain-source paths and said respective loads, said respective first points being coupled to said respective outputs for the output signals $V_{S1}$ and $V_{S2}$, and whose gates are coupled to respective second points coupled to said common input via respective resistors $R_1$, $R_2$ constituting the resistances of the respective associated RC networks and whose gate-source capacitances $C_{GS}$ constitute the capacitances C of the respective associated RC networks, respective feedback branches coupled between the respective second points and the respective outputs for the signals $V_{S1}$ and $V_{S2}$, each feedback branch including, in cascade a resistor $R_0$ and a transmission line $L_O$, and wherein the parameters of the each feedback branch are interrelated by the following conditions:

a) $Z = R_O$
b) $l = \tau v$
c) $R_O = 2/G_{MO}$ where:
Z is the characteristic impedance of the line $L_O$
l is its physical length
v is the phase velocity of propogation
$\tau$ is the transit time of electrons under the gate of the respective transistor $Q_1$ and
$G_{MO}$ is the transductance of the respective transistor $Q_1$.

9. A circuit as claimed in claim 1, wherein the field effect transistor $Q_I$ is of the HEMT or MESFET type, integrated, as are the other elements of the circuit, on a gallium arsenide substrate (GaAs).

10. A circuit as claimed in claim 8, wherein the field effect transistors $Q_1$ are of the HEMT or MESFET type, integrated, as are the phase-shift other elements of the circuit, on a gallium arsenide substrate (GaAs).

11. A circuit as claimed in claim 10, wherein the input impedance at the input for $V_E$ is of the order of 50 Ω, and in that the output impedance at each of the outputs for signals $V_{S1}$ and $V_{S2}$ is of the order of twice this input impedance.

* * * * *